United States Patent
Berge et al.

(10) Patent No.: US 9,778,678 B2
(45) Date of Patent: Oct. 3, 2017

(54) METHOD AND APPARATUS FOR CLOCKED DATA EYE MEASUREMENT

(71) Applicant: International Business Machines Corporation, Armonk, NY (US)

(72) Inventors: Layne A. Berge, Rochester, MN (US); Benjamin A. Fox, Rochester, MN (US); Wesley D. Martin, Elgin, MN (US); George R. Zettles, IV, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 28 days.

(21) Appl. No.: 14/830,138

(22) Filed: Aug. 19, 2015

(65) Prior Publication Data

US 2017/0052558 A1 Feb. 23, 2017

(51) Int. Cl.
  *G06F 1/12* (2006.01)

(52) U.S. Cl.
  CPC ..................... *G06F 1/12* (2013.01)

(58) Field of Classification Search
  None
  See application file for complete search history.

(56) References Cited

U.S. PATENT DOCUMENTS

| | | | |
|---|---|---|---|
| 6,901,339 B2 | 5/2005 | Eskeldson et al. | |
| 6,995,553 B1* | 2/2006 | Nygaard, Jr. | G01R 13/029 324/76.19 |
| 7,034,723 B2 | 4/2006 | Suda et al. | |
| 7,461,287 B2 | 12/2008 | Dreps et al. | |
| 7,545,886 B2 | 6/2009 | Sonntag et al. | |
| 7,961,831 B2 | 6/2011 | Ran | |
| 8,619,848 B2 | 12/2013 | Jiang | |
| 8,634,510 B2 | 1/2014 | Kong et al. | |
| 8,837,657 B1 | 9/2014 | Amourah | |
| 2002/0175850 A1* | 11/2002 | Barnes | G01S 13/0209 342/22 |
| 2006/0190200 A1* | 8/2006 | Nygaard, Jr. | G01R 13/0218 702/68 |
| 2010/0241918 A1* | 9/2010 | Nedovic | H03L 7/0807 714/746 |
| 2012/0170697 A1* | 7/2012 | Hsu | H04L 7/0338 375/355 |
| 2014/0184907 A1* | 7/2014 | Yoshida | H04N 5/21 348/497 |
| 2014/0333352 A1 | 11/2014 | Lakkis | |
| 2014/0347108 A1 | 11/2014 | Zerbe et al. | |

OTHER PUBLICATIONS

Wong et al, "Edge and Data Adaptive Equalization of Serial-Link Transceivers," Solid-State Circuits, IEEE Journal of vol. 43, Issue: 9, Publication Year: 2008, pp. 2157-2169.

* cited by examiner

*Primary Examiner* — Nitin Patel
(74) *Attorney, Agent, or Firm* — Patterson + Sheridan, LLP

(57) ABSTRACT

Method and apparatus for clocked data eye measurement at synchronous interfaces is provided. A receiver may generate first vector information corresponding to data received on at least one communication channel at the receiver. The receiver may generate second information regarding when the data was latched by a clock signal, the clock signal being received on a separate communication channel at the receiver. The first vector information may be combined with the second information to generate combined information, the combined information indicating a quality of latching the data.

19 Claims, 9 Drawing Sheets

METHOD AND APPARATUS FOR CLOCKED DATA EYE MEASUREMENT

FIELD

The present invention generally relates to data processing systems, and more specifically, to clocked data eye measurement in synchronous interfaces.

BACKGROUND

Modern data processing systems require the rapid transfer of data between integrated circuits ("chips"). For example, a central processing unit (CPU) transfers data to the memory system, which may include a memory controller and off-chip cache. In a multi-CPU system, data may be transferred between CPUs. As CPU speeds increase, the speed of the interface between chips (bus cycle time) becomes a limiting constraint because latencies across the interfaces may exceed the system clock period.

When data is launched from one chip to another chip, it can be launched simultaneously within numerous clock/data groups. Each clock/data group consists of multiple data bits and a clock signal, each of which travels over an individual conductor. Due to process variations and varying conductor lengths, the individual bits within a clock/data group may arrive at the receiving chip at different instances. Therefore, the individual bits of data and the clock within a clock/data group must be realigned upon arrival on the receiving chip. At the receiving end, the clock/data signals can be delayed to align the signals with respect to a sampling edge of the received clock. While, aligning the individual data bits within a clock/data group at the receiving end is necessary, such delays can cause jitter and other forms of distortion. In addition to causing jitter and distortion, delaying data signals can require extensive administrative overhead and additional circuitry.

Thus, there is a need in the art for apparatus and methods to accommodate high speed data transfers between chips in data processing systems. In particular, there is a need for mechanisms to ensure data synchronization at a synchronous interface if it is a receiving chip while limiting the associated jitter and distortion that is often created during such synchronization.

Eye diagrams are a conventional format for representing parametric information about signals, and especially digital signals. The width of the eye opening defines the time interval over which the received signal can be sampled without imposition of errors such as errors caused by inter-symbol interference. Additional parameters associated with an eye pattern such as the slope of the pattern can be a measure of receiver sensitivity, while the vertical eye opening can define a noise margin for the receiver. Various prior art eye diagram testers are known, but we shall call the technique described in the two incorporated Applications, an Eye Diagram Analyzer, or EDA for short.

A modern eye diagram for a digital signal is not so much a trace formed continuously in the time domain, as it is an "eye" shape composed of closely spaced points (illuminated pixels) representing many individual measurement (time, voltage) samples taken upon separate instances of a signal occurring on a channel of interest, and which were then stored in a memory. Each measurement sample contributes to a displayed pixel. The eye shape appears continuous because the collection of pixels is rather dense, owing to the large number of times that the signal is sampled. Unlike a true continuous technique, however, there may be detached pixels that are separated from the main body of the eye shape.

In any event, the vertical axis is voltage, and the horizontal axis represents the differences in time (i.e., various offsets) between some reference event and the locations for the measurement samples. The reference event is generally an edge of a clock signal in the system under test, and represents directly or through some fixed delay the expected point in time when the value of an applied data signal would be captured by some receiving circuit in an SUT (System Under Test), and is derived from an application of the SUT's clock to the Eye Diagram Analyzer. The time axis will generally have enough length to depict one complete eye-shape (cycle of a SUT signal) centered about the reference, with sometimes perhaps several additional eyes (cycles) before and after. A bit period is generally a measure of the horizontal opening of an eye diagram at the crossing points of the eye and is usually measured in picoseconds for a high speed digital signal. The bit period is commonly called the Unit Interval (UI) when describing an eye diagram. The advantage of using UI instead of actual time on the horizontal axis is that it is normalized and eye diagrams with different data rates can be easily compared.

Different (X, Y) regions within a (sample) space containing an eye diagram represent different combinations of time and voltage. Assume that the eye diagram is composed of a number of pixels, and temporarily assume that the resolution is such that each different (X, Y) pixel position can represent a different combination of time and voltage (and vice versa), which combinations of time and voltage we shall term "measurement points." What the Eye Diagram Analyzer measures is the number of times, out of a counted number of clock cycles, that the signal on the channel being monitored passed through a selected measurement point. Then another measurement point is selected, and the process repeated until there are enough measurement points for all the pixels needed for the display. Points along the visible eye diagram trace describe something about those (time, voltage) combinations that were observed to actually occur in the data signal under test.

The value of a (time, voltage) combination is represented by its location, but the color or intensity of the measured result is determined in a way that assists in further appreciating the meaning of the measured data, such as how often a (time, voltage) point was occupied by the signal being measured. The range over which the measurement points are varied is called a "sample space" and is defined during a measurement set-up operation. And in reality, we define the sample space and the resolution for neighboring measurement points first, start the measurement and then let the analyzer figure out later how to ascribe values to the pixels of the display. The "display" is, of course, an arbitrary graphic output device such as a printer or an X Window of some as yet unknown size in a window manager (e.g., X11) for a computer operating system. (A one-to-one correspondence between display pixels and measurement points is not required. It will be appreciated that it is conventional for display systems, such as X Windows, to figure out how to ascribe values to the pixels for an image when the correspondence between the display's pixel locations and the measurements that are the original image description is not one-to-one.)

SUMMARY

Certain aspects of the present disclosure provide a method performed by a receiver. The method generally includes generating first vector information corresponding to data received on at least one communication channel at the receiver, generating second information regarding when the data was latched by a clock signal, the clock signal received on a separate communication channel at the receiver, and combining the first vector information and the second information to generate combined information, the combined information indicating a quality of latching the data.

Certain aspects of the present disclosure provide an apparatus at a receiver. The apparatus generally includes means for generating first vector information corresponding to data received on at least one communication channel at the receiver, means for generating second information regarding when the data was latched by a clock signal, the clock signal received on a separate communication channel at the receiver, and means for combining the first vector information and the second information to generate combined information, the combined information indicating a quality of latching the data.

Certain aspects of the present disclosure provide a computer program product comprising a computer-readable storage medium having computer-readable program code embodied therewith for performing method steps at a receiver. The method steps generally include generating first vector information corresponding to data received on at least one communication channel at the receiver, generating second information regarding when the data was latched by a clock signal, the clock signal received on a separate communication channel at the receiver, and combining the first vector information and the second information to generate combined information, the combined information indicating a quality of latching the data.

DETAILED DESCRIPTION

To clearly point out novel features of the present invention, the following discussion omits or only briefly describes conventional features of information processing systems which are apparent to those skilled in the art. It is assumed that those skilled in the art are familiar with the general architecture of processors and memory devices and synchronous interfaces used to receive data by such devices. It may be noted that a numbered element is numbered according to the figure in which the element is introduced, and is referred to by that number throughout succeeding figures.

Figure 1:
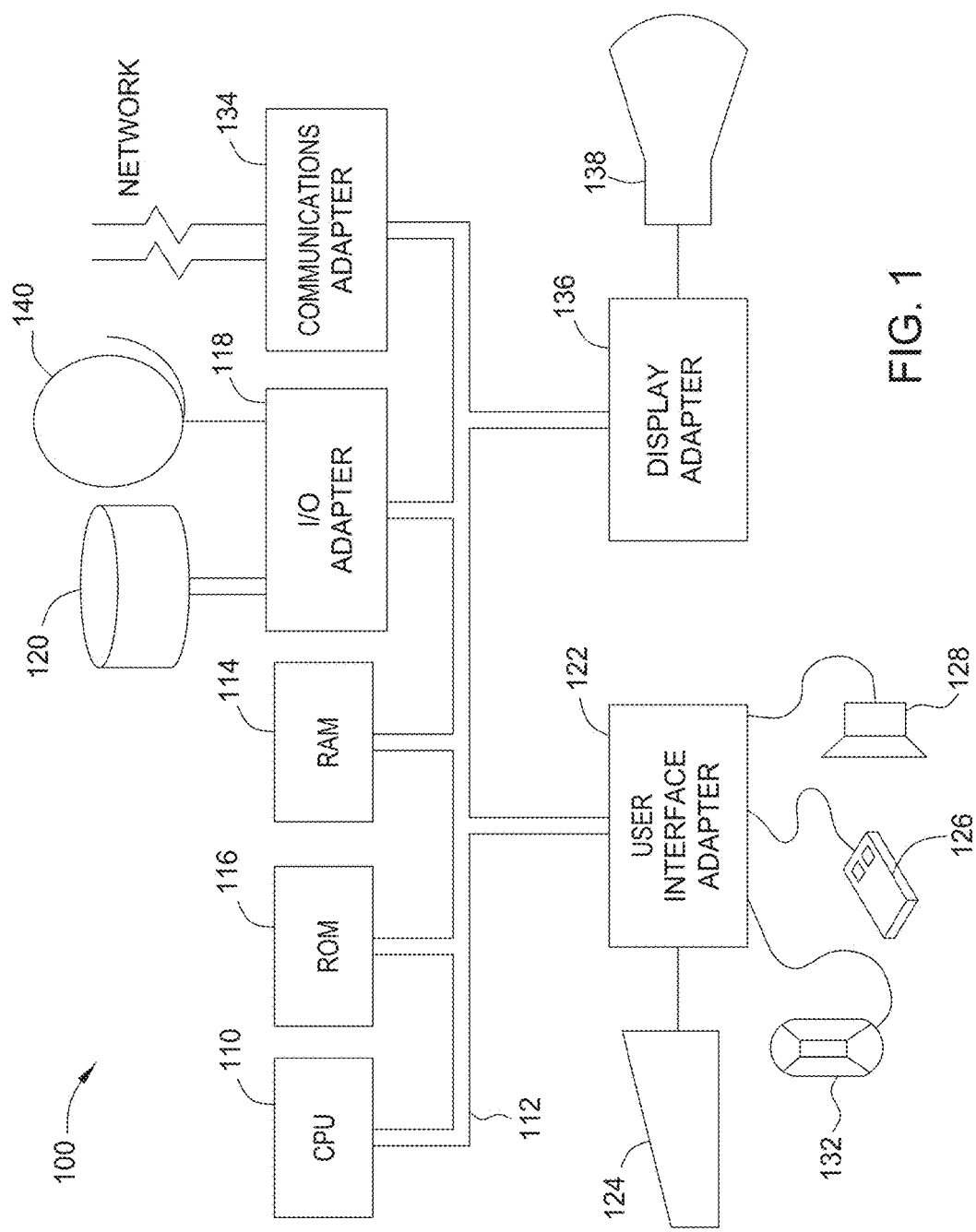
FIG. 1 illustrates an example of a data processing system in which aspects of the present disclosure may be practiced.

FIG. 1 illustrates an example of a data processing system 100 in which aspects of the present disclosure may be practiced. The system has a central processing unit (CPU) 110 such as a PowerPC microprocessor ("PowerPC" is a trademark of IBM Corporation). The CPU 110 is coupled to various other components by system bus 112. Read only memory ("ROM") 116 is coupled to the system bus 112 and includes a basic input/output system ("BIOS") that controls certain basic functions of the data processing system 100. Random access memory ("RAM") 114, I/O adapter 118, and communications adapter 134 are also coupled to the system bus 112. I/O adapter 118 may be a small computer system interface ("SCSI") adapter that communicates with a disk storage device 120. Communications adapter 134 interconnects bus 112 with an outside network enabling the data processing system to communicate with other such systems. Input/Output devices are also connected to system bus 112 via user interface adapter 122 and display adapter 136. Keyboard 124, track ball 132, mouse 126 and speaker 128 are all interconnected to bus 112 via user interface adapter 122. Display monitor 138 is connected to system bus 112 by display adapter 136. In this manner, a user is capable of inputting to the system through the keyboard 124, trackball 132 or mouse 126 and receiving output from the system via speaker 128 and display 138. Additionally, an operating system such as AIX ("AIX" is a trademark of the IBM Corporation) is used to coordinate the functions of the various components shown in FIG. 1.

The CPU (or "processor") 110 includes various registers, buffers, memories, and other units formed by integrated circuitry, and operates according to reduced instruction set computing ("RISC") techniques. The CPU 110 processes according to processor cycles, synchronized, in some aspects, to an internal clock (not shown).

Synchronous interfaces are becoming more complex as their speeds increase. One of the major challenges for synchronous interfaces is the clock to data relationship, where increasing the speed of an interface decreases the maximum allowed skew between the clock and data. At the same time, jitter tolerances for the interfaces are decreasing. Receivers of these interfaces have had to adapt by increasing in complexity; often adding things like delay circuits, peaking amplification or DFE circuits.

Generally, each level of complexity added to the receiver has a tendency to change the specification points for the interface. For example, adding DFE or peaking may change the measurement point for the interface from the Ball Grid Array (BGA) to the input of the receiver circuit. For an electrical engineer, it is impossible to probe at the input of the receiver past the DFE and peaking circuitry. In order to help show the signal quality at the receiver input, various methods have been developed to plot eye diagrams.

Some systems use a sampling circuit with a clock derived from the data. However, these systems do not maintain the clock to data relationship in a synchronous interface. While an open eye is helpful, the relationship between where the data was latched by the clock is just as important. In these systems, an eye would be shown for each of the data bits and the clock separately, but their relationship in time is lost.

Figure 2:
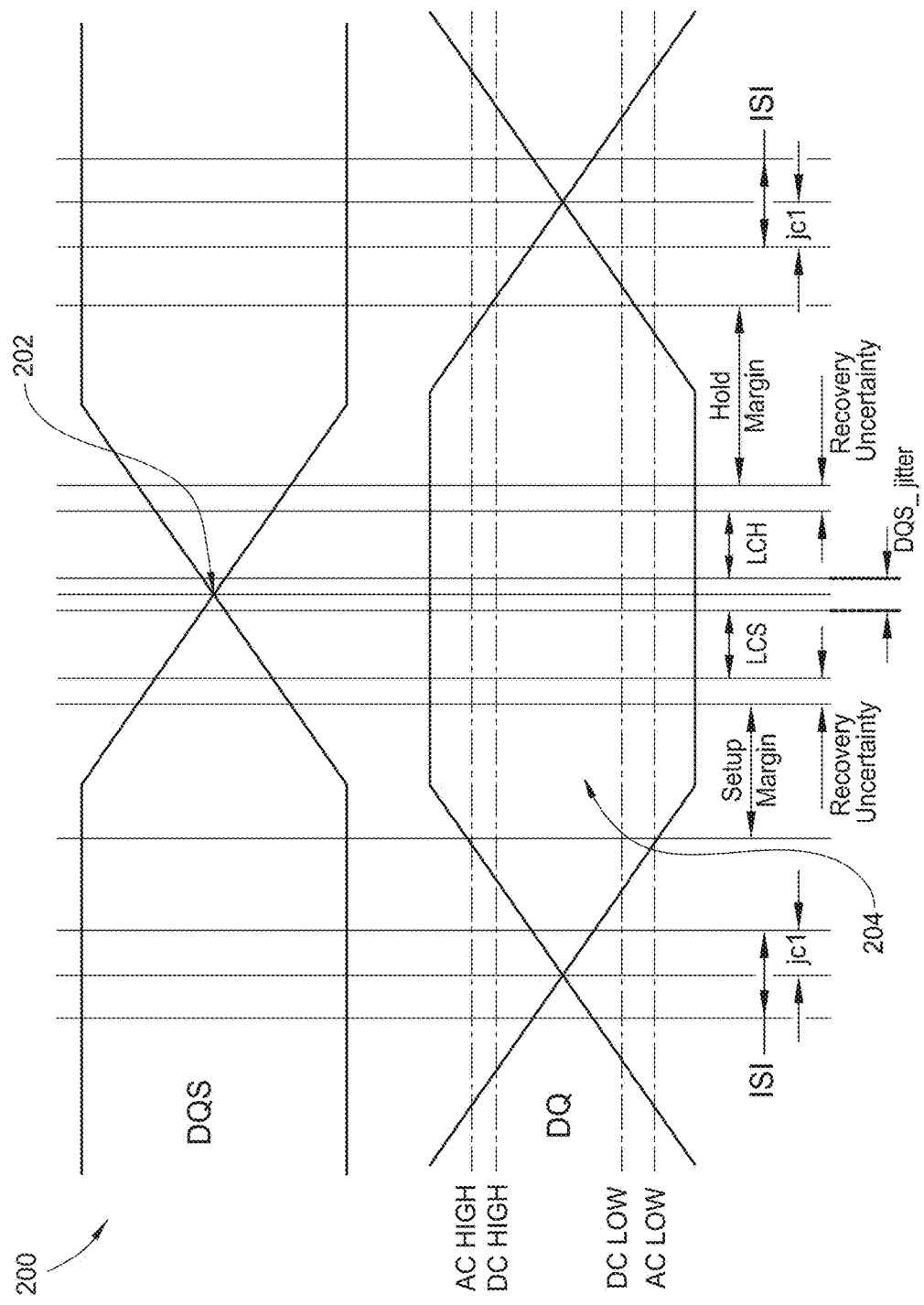
FIG. 2 illustrates an example of eyes measured for the clock (DQS) and data (DQ) at a receiver interface, shown separately, in accordance with certain aspects of the present disclosure.

FIG. 2 illustrates an example 200 of eyes measured for the clock (DQS) and data (DQ) at a receiver interface, shown separately by a system as discussed above. This system ignores that the crossing of the DQS (e.g., at 202) clocks the DQ bit. In an ideal world, the DQS crossing point 202 should be in the middle of the DQ bit eye (e.g., 204) as shown in the figure. But in the real world, there are delays in both the transmitter and receiver circuitry. Also depending on the design, there may be connectors, cables, and board wiring tolerances that will shift the DQS and DQ relationship.

While some interfaces have a delay circuit, these circuits have a certain level of error. With designs that are optimized for cost due to high volume, each of the budget terms (e.g., DQS jitter budget) shown in FIG. 2 may be large leaving very little for setup or hold margins. Because of these design points, it may be critical to understand the DQS offset across each of the DQ bits to ensure proper operation.

In certain aspects, interfaces like memory, where the clock is separate from the data, it is important to reference an eye opening to where the clock latches the data. There are generally setup and hold requirements that need to be verified. A wide open eye if not properly aligned may cause a number of problems.

Figure 3:
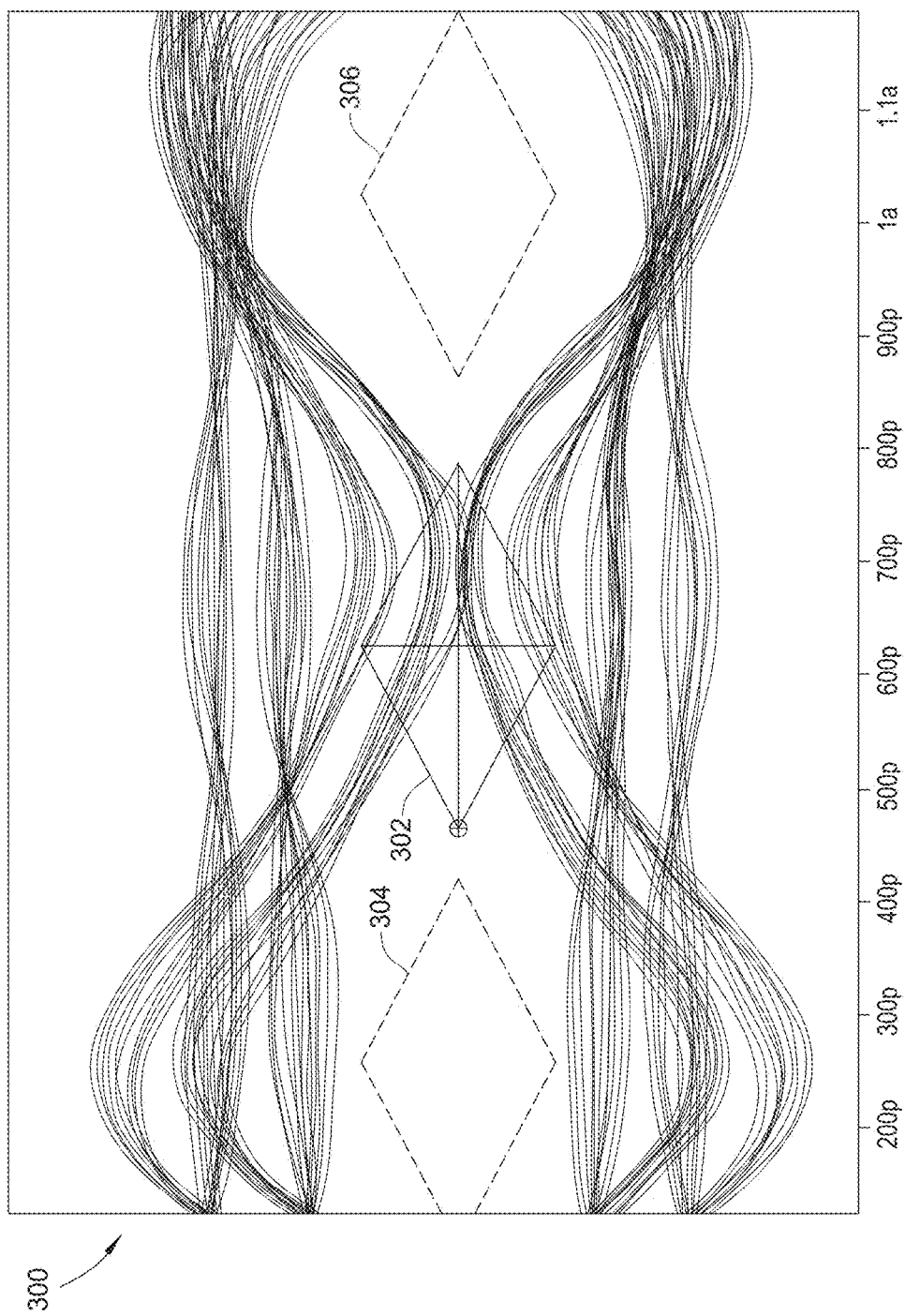
FIG. 3 shows a valid address eye with the mask centered in the middle of a unit interval, in certain aspects of the present disclosure.

FIG. 3 shows a valid address eye 300 with the mask centered in the middle of a unit interval, in certain aspects of the present disclosure. Diamond 302 shown in the middle of the unit interval over which the eye is measured, shows where a traditionally lined up clock may latch the data in. Thus, there is a violation with the mask and zero margin. However, if the clock were to be shifted to the right or left (e.g., by 0.25 UI), the interface may have plenty of margin. Diamonds 304 and 306 show the preferred clock latching positions, substantially in the middle of the data eye.

Current probing methodologies, e.g., for clam shell topology, will change where the reflection, that is causing the eye closure, is in the UI. This generally leads to different behaviors from a probed and non-probed DRAM, and may cause months of test time and simulation. Further, a user may see this eye 300 via the UI and think that a raw card change is needed to clean up wiring, or to move the reflection out of the center.

In certain aspects, validation of an interface (e.g., DDR memory interface) requires probes on each of the data lines along with the DQS (or clock). Measurements then need to be replicated in the lab to show the timing between DQ and DQS over time to get the early and late arrival of the DQ to DQS relationship. For example, for x4 DDR devices, this measurement entails probing 5 signals, and for a x16 device, 17 signals need to be analyzed at both the memory controller and at the DRAM. Lab analysis across multiple sorts and multiple vendors may take a considerable amount of bring up time and cause a significant amount of attrition on expensive probes.

In order to probe at the BGA boundary for a DDR device, a signal integrity engineer needs to use a custom interposer (e.g., Agilent's N2114 or N2115A BGA interposer). The interposer generally attaches between the PCB and the DRAM package breaking out every signal at the DRAM. These interposers allow signal integrity engineers to probe the incoming signals at the BGA boundary. However, the analysis benefit is not free. One of the biggest disadvantages of this setup is that the user needs to be able to attach the DRAM to the interposer or pay assembly costs of currently 1500.00 USD per DRAM to be probed. In a topology with 18 drops, it may cost at least 4500.00 USD per vendor to be qualified for just one type of a process sort. In a typical application where three vendors may need to be qualified across two process corners, the total cost for just probing one of each vendors corners may be 27000 USD. If the signal integrity engineer wanted to test a sample size for each of these vendors, say three of each, it may be almost 100,000 USD in just probing costs, assuming there is no damage from probing or accidents in the lab. In addition to that, there may be software costs that the oscilloscope requires to use these devices. Thus, for the average company, the probing costs for such a method may be prohibitive. This method is also required for any topologies that uses the clam shell approach where components are placed on both sides of the board making it impossible to probe at the device.

Figure 4:
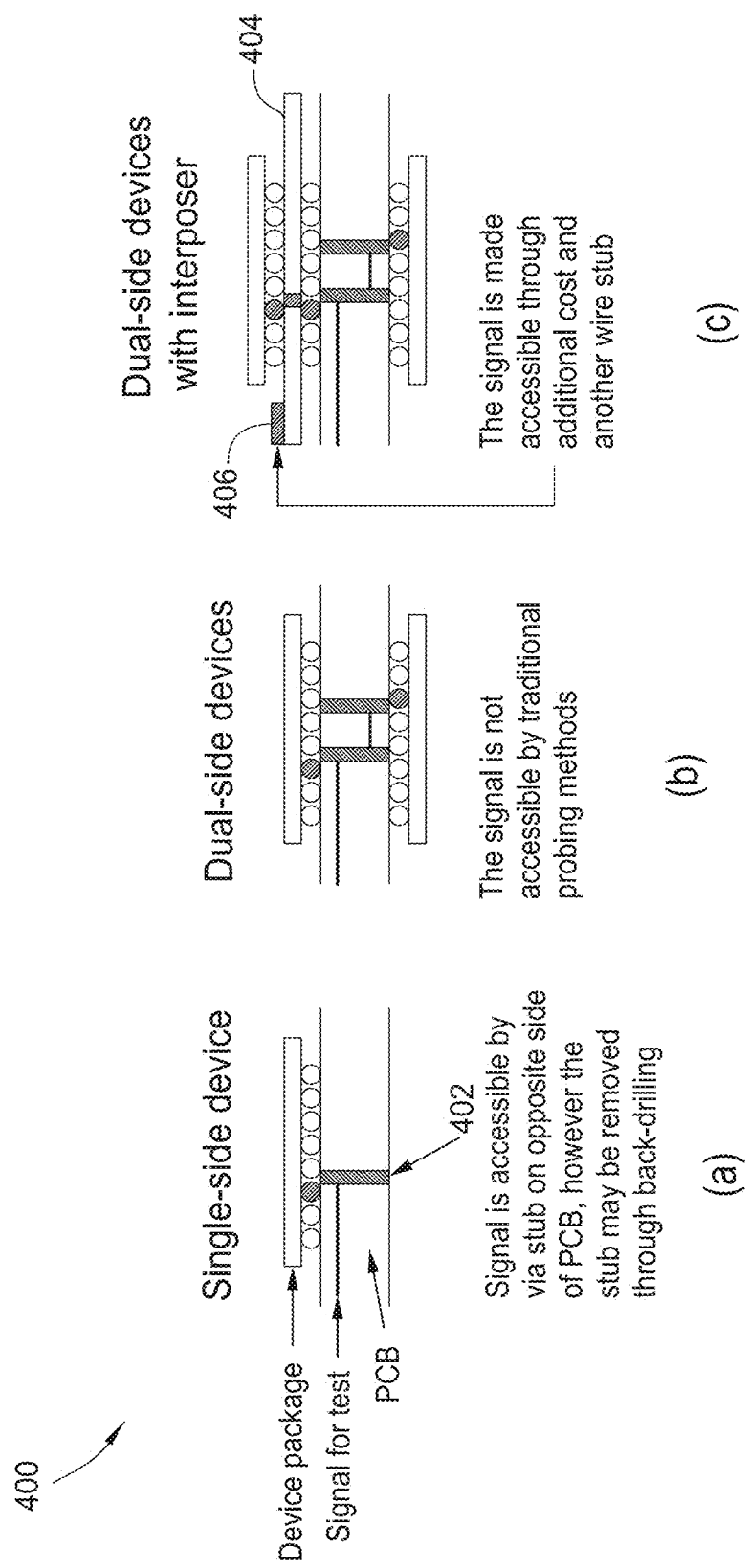
FIG. 4 illustrates probing in example device designs, in accordance with certain aspects of the present disclosure.

FIG. 4 illustrates probing in example device designs 400, in accordance with certain aspects of the present disclosure. In the PCB cross-section shown in (a), traditional signal verification will make use of a via stub at 402 for probing. However as back-drilling and removal of the stub is more common with higher-speed interfaces there may be no access to the signal. In the PCB cross-section (b) shows how some interfaces stack devices on either side of the PCB removing any physical access to the signal under test. PCB cross-section (c) shows that a dual-sided topology may be made accessible through the use of an interposer 404, which bridges the PCB and package while fanning out a probe location. This is done so at additional cost and the addition of an electrical stub 406. This stub 406 then has to be characterized and de-embedded by the scope to provide a more accurate view of the signal at the pin. Thus, as shown in FIG. 4, sometimes the design topology does not allow for easy verification of an interface.

Another method uses a slicing circuit to measure an eye then changes the receiver characteristics to optimize the eye. Again, this is a good method for measuring an eye opening, but again, the relationship to the clock is lost, which means this method too suffers the same short comings discussed above.

Thus, there is a need for an effective and relatively inexpensive technique that measures the relative relationship between the data and the clock at receiver interfaces.

Aspects of the present disclosure provide on-chip circuitry for aligned and correlated data eye detection. Such circuitry may provide a solution to understanding margins on an interface which would otherwise have been made physically inaccessible, for example, due to back-drilling or dual-sided topologies, without the added cost for external hardware or time spent de-embedding fixtures.

Figure 5:
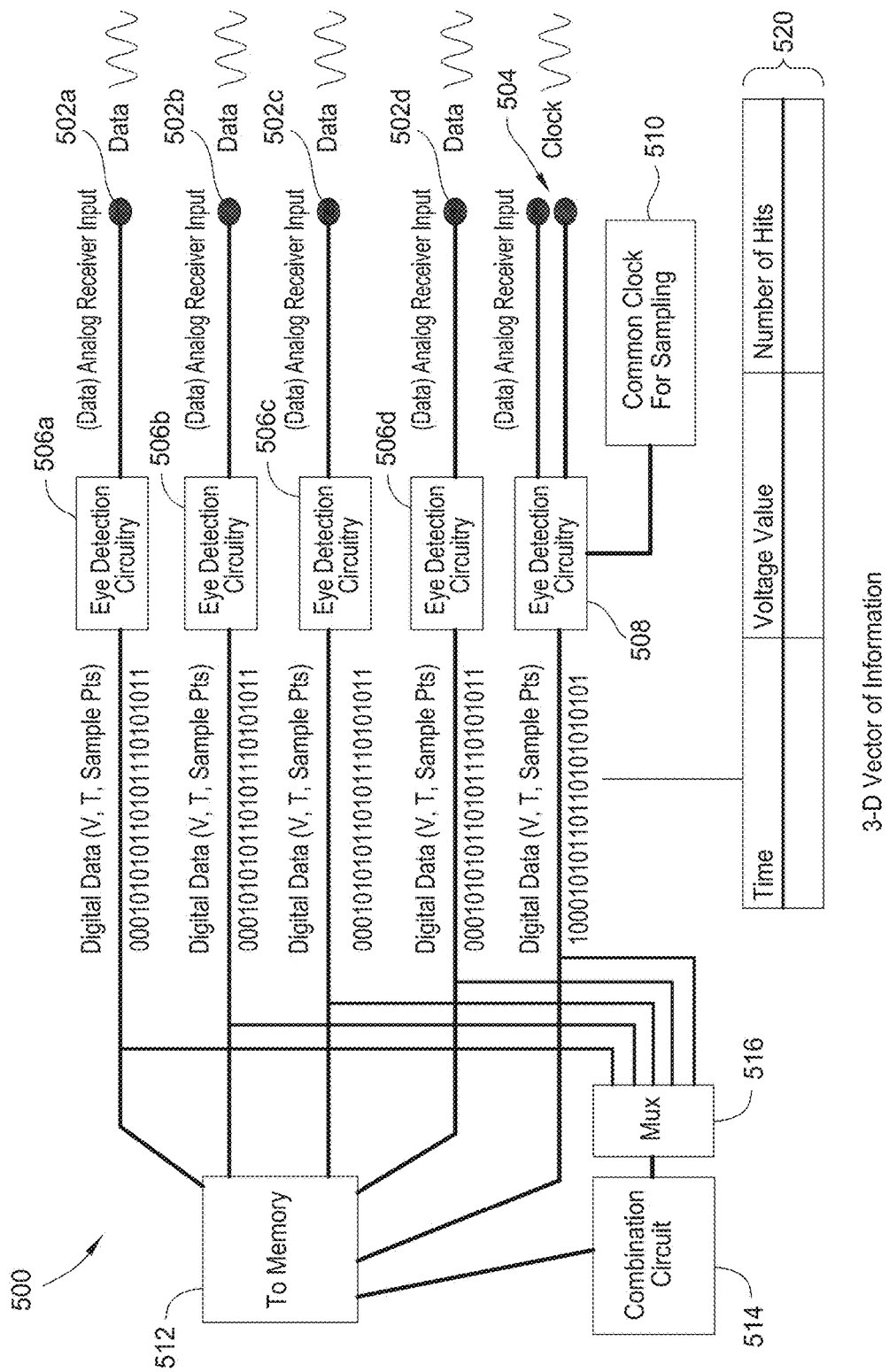
FIG. 5 illustrates a data receiver including on-chip circuitry for correlated data eye detection, in accordance with certain aspects of the present disclosure.

FIG. 5 illustrates a data receiver 500 including on-chip circuitry for correlated data eye detection, in accordance with certain aspects of the present disclosure.

FIG. 5 shows a x4 topology including four data input channels 502a-d and a separate clock channel 504. As shown, four separate data signals are received on the corresponding four data channels 502a-d on the far right of the data receiver 500 with a clock signal received on the clock channel 504 that is supposed to latch in the data. In an aspect, the clock input 504 is a differential clock input having two inputs (as shown). Each of the data channel lines 502a-d and the clock channel line 504 is coupled to a memory 512 configured to store data received on the data and clock channels. Receiver 500 further includes eye detection circuitry 506a-d coupled to each data channel 502a-d respectively. Receiver 500 also includes eye detection circuitry 508 coupled to the clock channel 504. A local clock 510 is coupled to each of the eye detection circuitry 506a-d and 508, and provides a common clock signal for sampling received data and clock signals. A multiplexer 516 coupled to a combination circuit 514 taps each of the data and clock channel lines in parallel and feeds data to the memory 512. In certain aspects, the eye detection circuitry 506a-d and 508, along with the local clock 510, multiplexer 516 and the combination circuit 514 are part of the correlated eye detection mechanism according to certain aspects of the present disclosure.

Each eye detection circuit 506a-d and 508 samples the incoming analog signal (data signal or clock signal) based on the local clock signal 510, and converts it to a digital bit stream of information. Each data bit stream of information generated by an eye detection circuit includes 3D vector information 520. The 3D vector information 520 includes data vector points, each data vector point including a combination of a voltage value (V), a time value (T) at which the voltage value was measured relative to a UI, and sample points representing a number of times the voltage value (V) was detected at the corresponding time (T). Thus, each eye detection circuit generates a 3D vector (V, T, Sample Pts). For example, a data point may include (Voltage (0.944 V), Time (300 pS), Sample Pts (102, i.e., number of hits at the time and voltage)) In an aspect, since eye diagrams take a set Unit Interval and over lap each bit over the interval, the eye detection circuits may produce a vector that has time (T) relative to the unit interval. The local clock 510 provides a common clock for sampling at each of the eye detection circuits 506a-d and 508, in order to preserve when the clock 504 latched the data relative to each detection circuit 506a-d.

In certain aspects, when eye detection is started (e.g, in a DRAM or a Memory controller) the device allocates a portion of the memory 512 for storing the vector information (e.g., vector storage of time and voltage sampling positions) generated by the eye detection circuits. Once the memory is allocated, sampling on the data signals 502a-d and clock signal 504 may begin based on the common clock 510. Each sample, a check may be done to see if the clock 504 is latching the data in. If not, the voltage and time corresponding to the sample may be sent to the memory 512. If that voltage and time has been seen before, the number of hits may be incremented by 1. If that voltage and time has never been seen before, then a 1 may be used to start a timer. In an aspect, when a clock edge is detected or when the clock is suppose to latch the data, the latch time is sent to the combination circuit 514 to include a time and voltage for the clock latch to be added to the memory keeping track of each of the data's eye detection vectors. In an aspect, the multiplexer 516 may take the rising and falling crossing point of the clock signal 504 and superimpose that on each of the data vectors. For example, if the clock switching happens at 300 pS, the multiplexer 516 and the combination circuit 514 may superimpose a +1 to the quantity for every voltage at time of 300 pS. In an aspect, the quantities at V, T may be large at the point where the clock has latched the data.

In a simple case, a second vector having Time and Hits may be linked to each of the datas that simply stores the time (e.g., in terms of UI) and the number of hits latch at that time.

Figure 6:
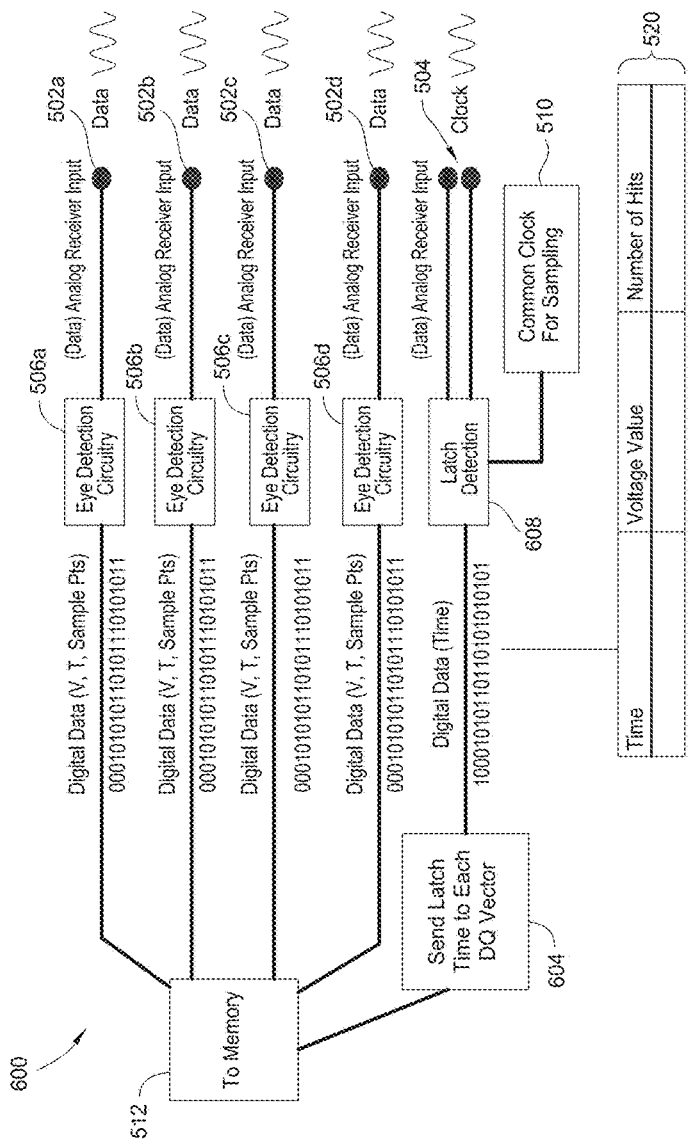
FIG. 6 illustrates a data receiver including alternate on-chip circuitry for correlated data eye detection, in accordance with certain aspects of the present disclosure.

FIG. 6 illustrates a data receiver 600 including alternate on-chip circuitry for correlated data eye detection, in accordance with certain aspects of the present disclosure. The eye detection mechanism of FIG. 6 uses the same mechanism for detection of the data eye as discussed with reference to FIG. 5. However, eye detection mechanism of FIG. 6 differs from that shown in FIG. 5 in that receiver 600 includes a latch detection circuit 602 for the clock line 504, instead of the eye detection circuit 508 as shown in FIG. 5. The latch detection circuit 602 records time T only of each clock latch and sends 604 the latch time to the memory 512 for storage with the data vectors as combined vector information. Thus, in this case the eye contour of the clock in not maintained.

Figure 7:
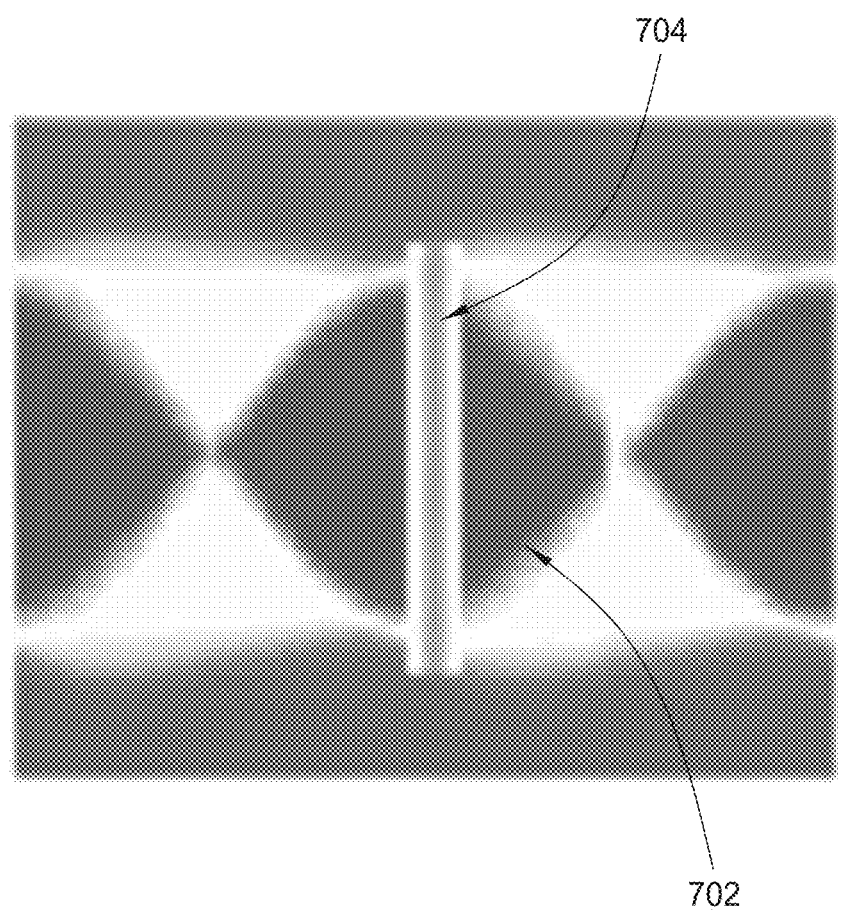
FIG. 7 illustrates a contour plot of the data eye with a vertical contour of the clock, in accordance with certain aspects of the present disclosure.

In certain aspects, the combined vector information stored in the memory may be used to generate plots of correlated eye diagrams. For example, an eye detection software (or firmware) may generate a contour plot of the data eye with a vertical contour of the clock showing were exactly the clock latches the data within the data eye. FIG. 7 illustrates a contour plot 700 of the data eye with a vertical contour of the clock, in accordance with certain aspects of the present disclosure. As shown the plot 700 includes a contour plot of the data eye (e.g., 702) and a vertical contour plot of the clock 704 showing the data latching position of the clock within the data eye 702.

In certain aspects, a visual of the plot 700 may be shown to a user via a user interface on a display device, showing the clock latching. In an aspect, based on the visual plot, the user may optimize delay of the clock (e.g., manually) through firmware (e.g., in the memory core), to switch the clock latching in an open section (e.g., substantially in the center) of the data eye to get the most margin, without having to re-simulate and pay for an additional raw card. Thus, the techniques discussed above may provide a visual tool to help a user correct the clock latching.

In certain aspects, a processor coupled to the memory 512 may be configured to read the combined vector data (e.g., superimposed clock vector over data vector) stored in the memory 512, determine a current latching position based on the read vector data, and then internally adjust the clock latching position, without user intervention. In this case there is no need for generating a visual plot for the user to see. Although, a visual plot may be generated anyway for monitoring performance.

In certain aspects, by implementing the on-chip circuitry discussed above in FIGS. 5 and 6 in a memory controller, the user may be able to avert a large lab bring up expense saving on scopes, costly probing equipment (BGA Interposers) and simulation licenses.

It may be noted that the eye detection circuits 506a-d and 508 may include any currently available eye detection circuitry that accepts analog inputs and generates the vector information as discussed above. Further, while FIG. 5 shows a receiver in x4 configuration, the mechanisms discussed in this disclosure may be used with receivers having any configuration, for example, having any number of data lines. In certain aspects, the above described mechanisms may be used with any interface having separate data and clock channels.

In certain aspects, the eye detection circuits and/or latch detection circuits may be enabled as and when needed to save power. For example, a parallel tap may be set to the digital data and clock going to the memory (or memory controller). In this way the digital data and the clock signals may be delivered directly to the memory without passing through the eye detection and latch detection circuitry. The eye and latch detection circuitry may be turned on to measure the eyes as and when needed.

Figure 8:
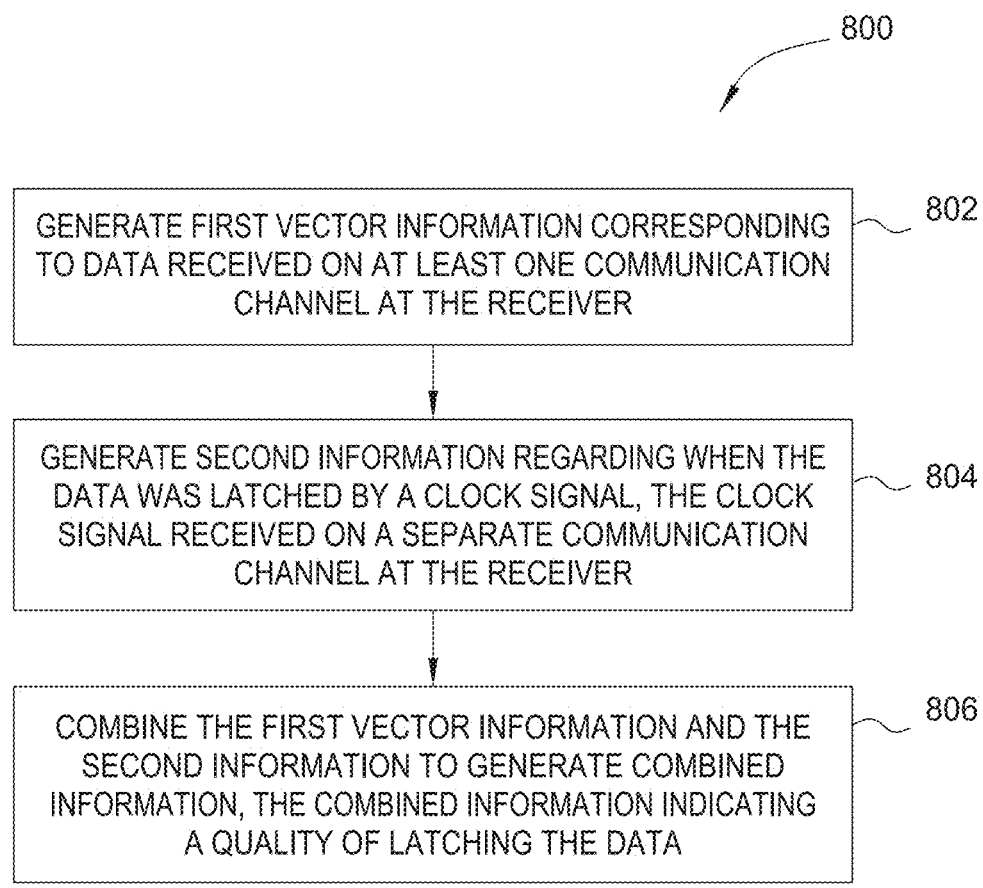
FIG. 8 illustrates example operations for correlated eye detection of data and clock signals at a receiver, in accordance with certain aspects of the present disclosure.

FIG. 8 illustrates example operations 800 for correlated eye detection of data and clock signals at a receiver, in accordance with certain aspects of the present disclosure. Operations 800 may begin, at 802, by generating first vector information corresponding to data received on at least one communication channel at the receiver. At 804, the receiver may generate second information regarding when the data was latched by a clock signal, the clock signal received on a separate communication channel at the receiver. At 806, the first vector information may be combined with the second information to generate combined information, the combined information indicating a quality of latching of the data.

In certain aspects, circuitry for correlated eye detection as discussed above may be used at the receiver interface of any device (e.g., memory devices) that receive digital data and clock signals. For example, the above discussed mechanisms may be applied at the receiver circuitry of a DRAM, and may be controlled by the DRAM memory controller.

Figure 9:
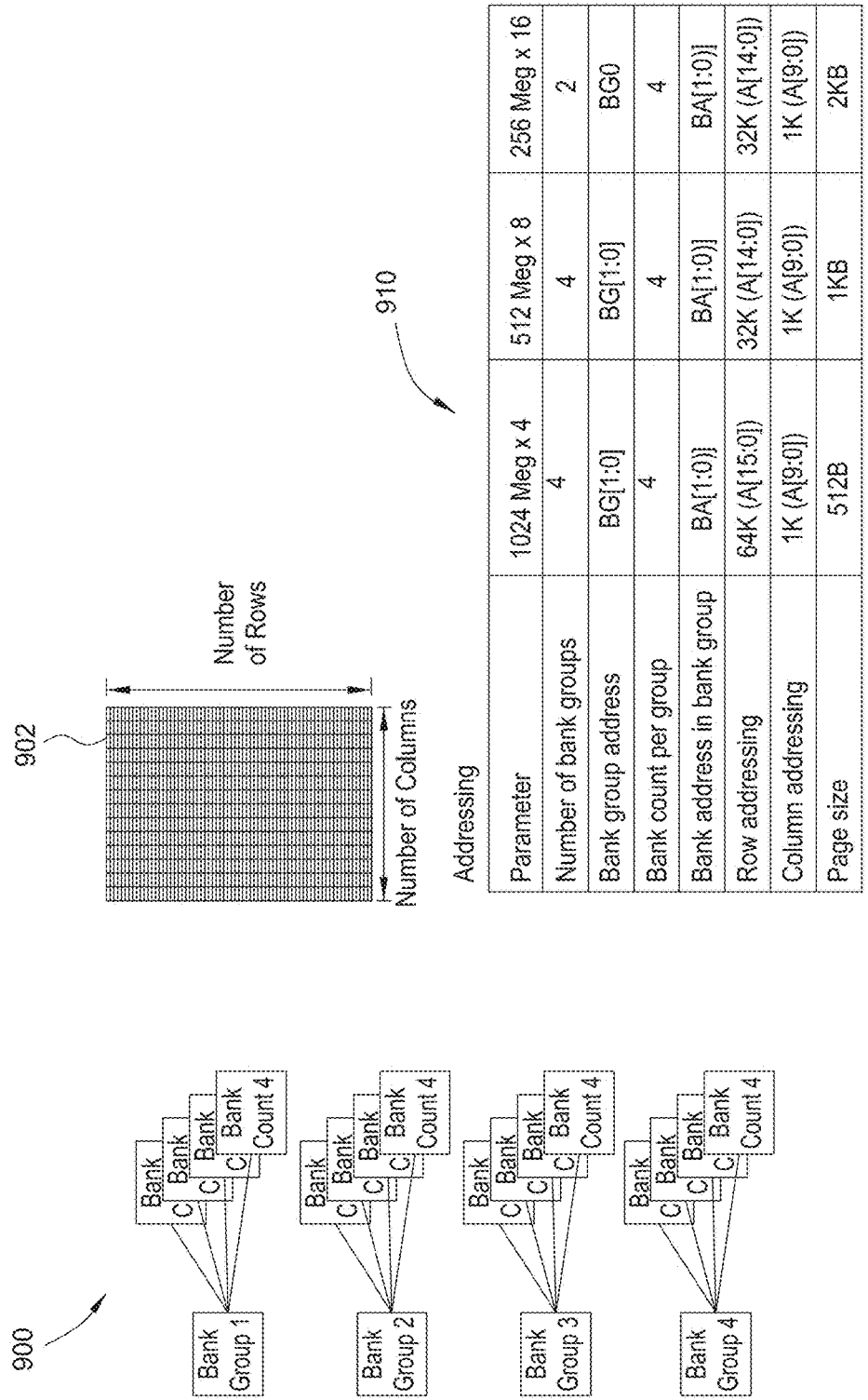
FIG. 9 illustrates a DRAM in which aspects of the present disclosure may be practiced, in accordance with certain aspects of the present disclosure.

FIG. 9 illustrates a DRAM in which aspects of the present disclosure may be practiced, in accordance with certain aspects of the present disclosure. As shown in FIG. 9, for addressing purposes, DRAM 902 may be logically divided into a number of bank groups (e.g., groups 1-4 as shown), each bank group including a number of bank counts (e.g., 4 bank counts as shown). Table 910 shows how the DRAM 902 may be addressed.

In certain aspects, to implement the correlated eye detection mechanism as discussed above in the DRAM 902, data received by the DRAM may be written in three of the four banks, and one bank may be allocated for storing information (e.g., vector information and combined vector information) generated by the eye detection circuitry. In an aspect, if a user needs longer testing, more than one bank may be used for the correlated eye detection. In an aspect, the impact on the DRAM is minimal as a result of implementing the correlated eye detection mechanisms discussed in this disclosure, as there is already an initialization and setup procedure defined. In an aspect, during the initialization, a manufacturer of the DRAM may configure memory management for the eye detection mode by using the memory controller.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method performed by a receiver, comprising: receiving, at the receiver, data on at least one communication channel and a clock signal on a separate communication channel; generating first vector information corresponding to the data received on the at least one communication channel at the receiver; generating second information regarding when the data was latched by the clock signal; combining the first vector information and the second information to generate combined information, the combined information indicating a quality of latching the data; and adjusting a latching point of the data towards the center of a data eye, based on the generated combined information.

2. The method of claim 1, further comprising generating a plot of an eye diagram based on the combined information, the plot indicating when the data was latched by the clock relative to an eye of the data.

3. The method of claim 2, wherein the plot comprises a contour plot of the data eye with a vertical contour of the clock over a unit interval.

4. The method of claim 1, wherein generating the first vector information comprises sampling the received data based on a local clock to generate a plurality of data vector points, wherein each data vector point comprises a voltage value, a time at which the voltage value occurred relative to a unit interval, and a number of hits indicating how many times the voltage value was detected at the time.

5. The method of claim 4, wherein generating the second information comprises:
detecting a time at which the clock signal latched each data bit, wherein the second information comprises at least one of a voltage value at the detected time of latch or a time value of the detected time of latch relative to the unit interval.

6. The method of claim 5, wherein the combining comprises:
combining time values of the latches with each of the generated data vector points, the combined information comprising the data vector points combined with the time values of the latches.

7. The method of claim 4, wherein a sampling rate of the sampling is set above a Nyquist rate.

8. The method of claim 1, wherein a common local clock is used for sampling data received over a plurality of communication channels at the receiver.

9. The method of claim 1, further comprising:
allocating memory resources for storing one or more of the first vector information, the second information and the combined information.

10. The method of claim 9, wherein the allocated memory is accessible by a user interface for generating a plot of an eye diagram indicating when the data was latched by the clock relative to an eye of the data.

11. An apparatus at a receiver, comprising: means for receiving data on at least one communication channel and a clock signal on a separate communication channel; means for generating first vector information corresponding to the data received on the at least one communication channel at the receiver; means for generating second information regarding when the data was latched by the clock signal; means for combining the first vector information and the second information to generate combined information, the combined information indicating a quality of latching the data; and means for adjusting a latching point of the data towards the center of a data eye, based on the generated combined information.

12. The apparatus of claim 11, further comprising means for generating a plot of an eye diagram based on the combined information, the plot indicating when the data was latched by the clock relative to an eye or the data.

13. The apparatus of claim 12, wherein the plot comprises a contour plot of the data eye with a vertical contour of the clock over a unit interval.

14. The apparatus of claim 11, wherein the means for generating the first vector information is configured to sample the received data based on a local clock to generate a plurality of data vector points, wherein each data vector point comprises a voltage value, a time at which the voltage value occurred relative to a unit interval, and a number of hits indicating how many times the voltage value was detected at the time.

15. The apparatus of claim 14, wherein the means for generating the second information is configured to:
  detect a time at which the clock signal latched each data bit, wherein the second information comprises at least one of a voltage value at the detected time of latch or a time value of the detected time of latch relative to the unit interval.

16. The apparatus of claim 15, wherein the means for combining is configured to:
  combine time values of the latches with each of the generated data vector points, the combined information comprising the data vector points combined with the time values of the latches.

17. The apparatus of claim 14, wherein a sampling rate of the sampling is set above a Nyquist rate.

18. The apparatus of claim 11, wherein a common local clock is used for sampling data received over a plurality of communication channels at the receiver.

19. A computer program product comprising:
  a computer-readable storage medium having computer-readable program code embodied therewith for performing method steps by a receiver comprising:
    generating first vector information corresponding to data received on at least one communication channel at the receiver;
  generating second information regarding when the data was latched by a clock signal, the clock signal received on a separate communication channel at the receiver;
  combining the first vector information and the second information to generate combined information, the combined information indicating a quality of latching the data; and
  transmitting an instruction to adjust a latching point of the data towards the center of a data eye, based on the generated combined information.

\* \* \* \* \*